(12) United States Patent
Schulze et al.

(10) Patent No.: US 8,969,184 B2
(45) Date of Patent: Mar. 3, 2015

(54) METHOD FOR FABRICATING A POROUS SEMICONDUCTOR BODY REGION

(71) Applicant: Infineon Technologies Austria AG, Villach (AT)

(72) Inventors: Hans-Joachim Schulze, Taufkirchen (DE); Anton Mauder, Kolbermoor (DE); Francisco Javier Santos Rodriguez, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/903,784

(22) Filed: May 28, 2013

(65) Prior Publication Data

US 2013/0337640 A1    Dec. 19, 2013

Related U.S. Application Data

(63) Continuation of application No. 13/407,728, filed on Feb. 28, 2012, now Pat. No. 8,466,046.

(30) Foreign Application Priority Data

Mar. 1, 2011    (DE) .......................... 10 2011 012 721

(51) Int. Cl.
*H01L 21/00* (2006.01)
*H01L 21/02* (2006.01)
*H01L 21/762* (2006.01)
*H01L 29/861* (2006.01)

(52) U.S. Cl.
CPC .... *H01L 21/02658* (2013.01); *H01L 21/76202* (2013.01); *H01L 21/76224* (2013.01); *H01L 29/8611* (2013.01)

USPC .......................................................... 438/495

(58) Field of Classification Search
CPC ................... H01L 21/02658; H01L 21/76202; H01L 21/76224; H01L 29/8611
USPC .......... 438/386, 960, 421, 455, 478, 462, 495
See application file for complete search history.

(56) References Cited

U.S. PATENT DOCUMENTS

| | | | |
|---|---|---|---|
| 5,110,755 A * | 5/1992 | Chen et al. ..................... | 438/409 |
| 5,635,419 A * | 6/1997 | Geiss et al. .................... | 438/386 |
| 5,950,094 A | 9/1999 | Lin | |
| 6,326,292 B1 * | 12/2001 | Soderbarg et al. ............ | 438/597 |
| 7,101,772 B2 * | 9/2006 | Houston et al. ............... | 438/455 |
| 7,635,899 B2 | 12/2009 | Yang | |
| 2003/0175472 A1 | 9/2003 | Den | |
| 2005/0045984 A1 * | 3/2005 | Lin ............................... | 257/510 |
| 2008/0246055 A1 | 10/2008 | Schulze et al. | |
| 2009/0039428 A1 | 2/2009 | Wu | |
| 2010/0044838 A1 * | 2/2010 | Mauder et al. ................ | 257/620 |
| 2010/0065819 A1 * | 3/2010 | Wu ................................ | 257/21 |

FOREIGN PATENT DOCUMENTS

DE    102005046711 B4    12/2007
WO         2010083422 A1    7/2010

* cited by examiner

*Primary Examiner* — Telly Green
*Assistant Examiner* — Sophia Nguyen
(74) *Attorney, Agent, or Firm* — SpryIP, LLC

(57) ABSTRACT

A method for fabricating a porous semiconductor body region, including producing at least one trench in a semiconductor body, starting from a surface of the semiconductor body, producing at least one porous semiconductor body region in the semiconductor body starting from the at least one trench at least along a portion of the side walls of the trench, and filling the trench with a semiconductor material of the semiconductor body.

9 Claims, 4 Drawing Sheets

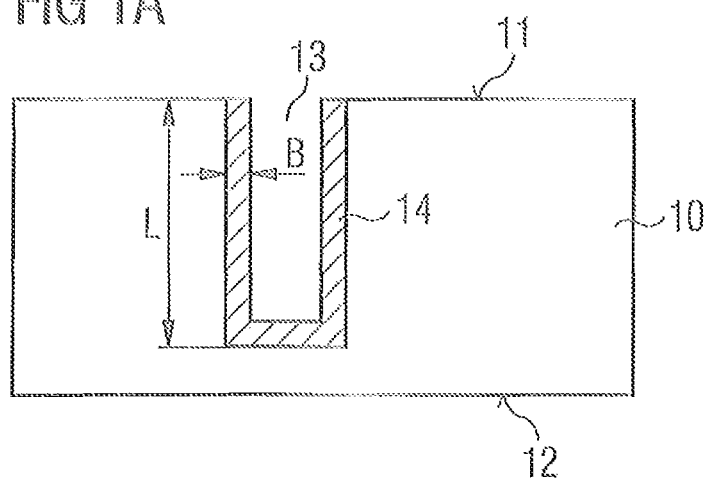
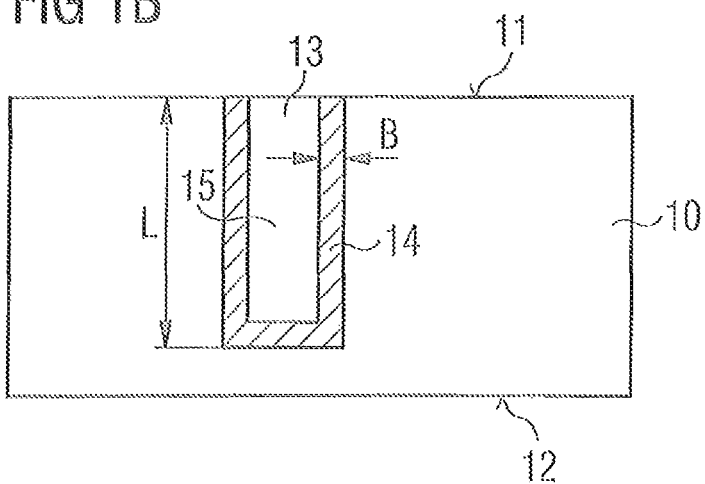

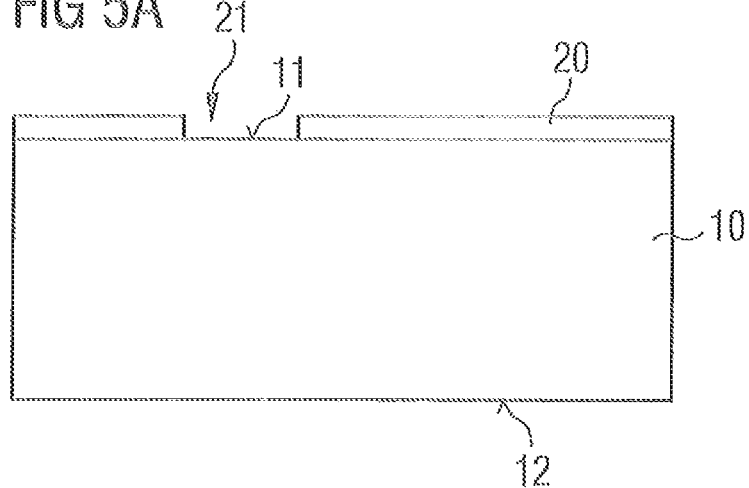
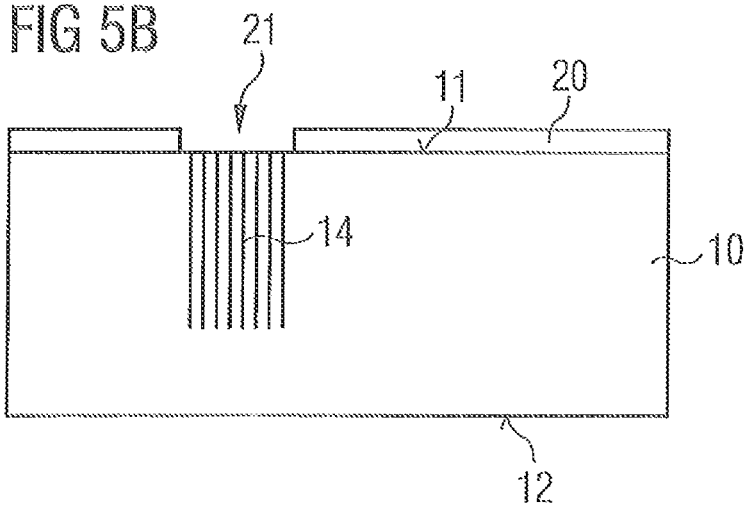
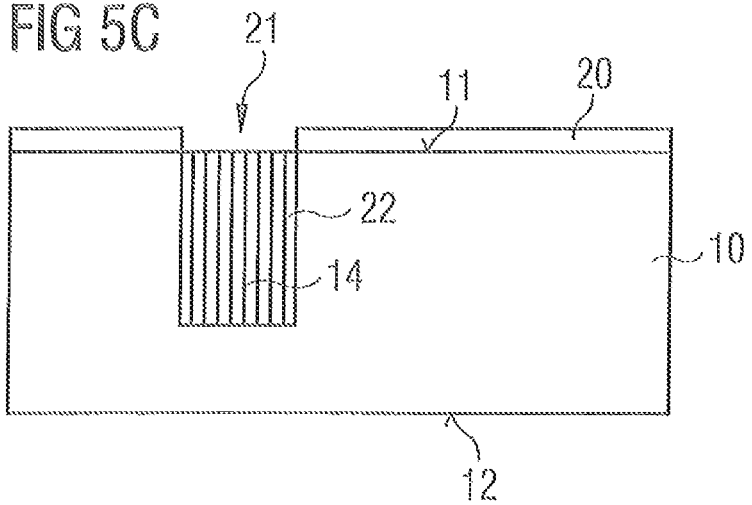

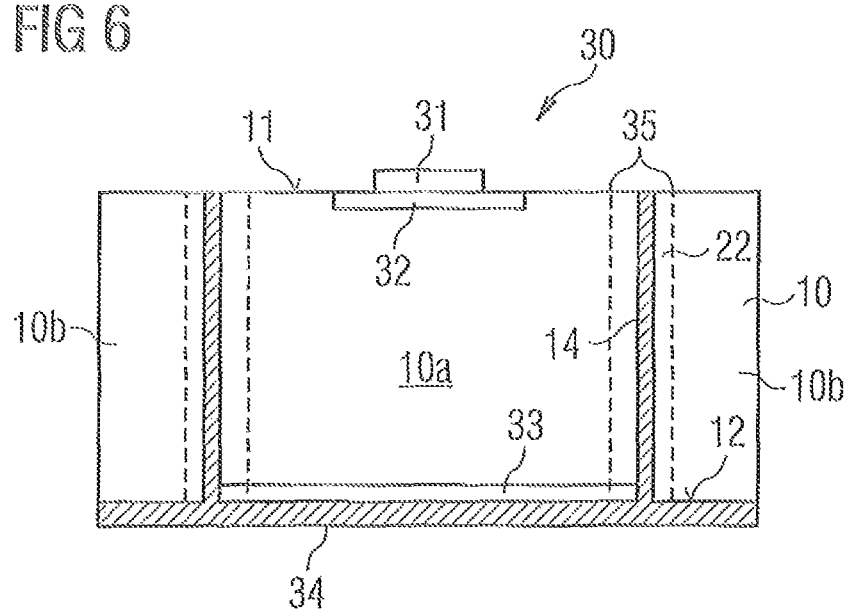

METHOD FOR FABRICATING A POROUS SEMICONDUCTOR BODY REGION

RELATED APPLICATIONS

This application is a Continuation application of co-pending application Ser. No. 13/407,728, which was filed on Feb. 28, 2012. The co-pending application claimed priority benefit to German Patent Application 102011012721, which was filed on Mar. 1, 2011. The entire contents of the co-pending application and the German Patent Application are incorporated herein by reference.

TECHNICAL FIELD

Exemplary embodiments of the present invention relate to a method for fabricating a deep porous semiconductor body region in a semiconductor body. Further exemplary embodiments relate to the fabrication of a deep foreign substance region of a semiconductor body using a porous semiconductor body region.

BACKGROUND

The fabrication of porous semiconductor body regions is known. By way of example, the production of a porous semiconductor body region by means of anodic oxidation has been shown. In this case, the porous semiconductor body region is fabricated by means of anodic oxidation of the semiconductor body from the rear of the semiconductor body into the semiconductor body.

It is desirable to provide a method for fabricating a locally bounded porous semiconductor body region deep in the semiconductor body. Furthermore, it is desirable to provide a method for fabricating a deep foreign substance region using a porous semiconductor body region.

BRIEF DESCRIPTION OF THE DRAWINGS

FIG. 1a and FIG. 1b illustrate a method for fabricating a porous semiconductor body region in a trench.

FIG. 5a to FIG. 5c illustrate the production of a foreign substance region in a semiconductor body along porous semiconductor body regions.

FIG. 6 shows a semiconductor element having continuous diffusion structures.

DETAILED DESCRIPTION OF THE DRAWINGS

Figure 2:
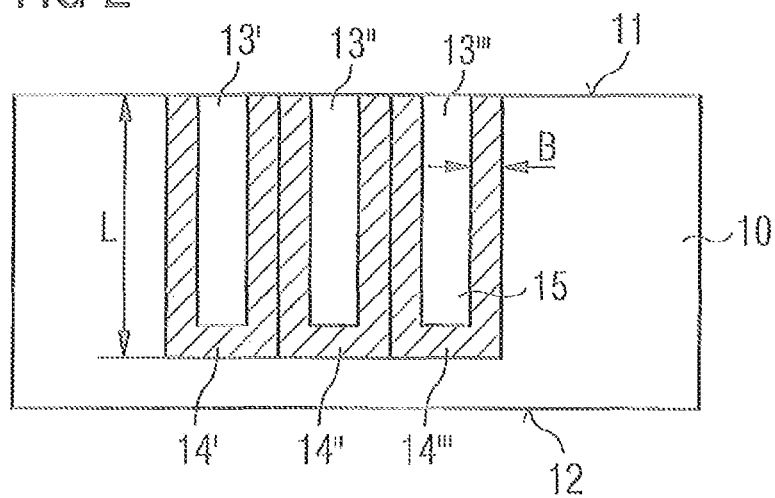
FIG. 2 shows the fabrication of a porous semiconductor body region in a plurality of trenches.

Exemplary embodiments of the invention are explained in more detail below with reference to the appended figures. However, the invention is not limited to the specifically described embodiments but rather can be modified and adapted in suitable fashion. It is within the scope of the invention to combine individual features and combinations of features from an embodiment with features and combinations of features from another embodiment in a suitable fashion in order to arrive at further embodiments according to the invention.

Before the exemplary embodiments of the present invention are explained in more detail below with reference to the figures, it is pointed out that elements which are the same in the figures have been provided with the same or similar reference symbols and that a repeated description of these elements is omitted. In addition, the figures are not necessarily true to scale. The focus is instead on explaining the fundamental principles.

FIG. 1 shows an exemplary embodiment of a method for fabricating a porous semiconductor body region in a semiconductor body. In this case, FIG. 1a shows an interim result in which a porous semiconductor body region 14 has been produced along a trench in a monocrystalline semiconductor body 10. The monocrystalline semiconductor body 10 may in this case comprise any known semiconductor material, such as silicon. By way of example, the monocrystalline semiconductor body may be a conventional semiconductor wafer, also called a wafer. Alternatively, it may be just one portion of such a wafer.

First of all, a trench 13 is produced in the semiconductor body 10 starting from a first surface 11 of the semiconductor body 10. In this case, the trench extends in a direction towards a surface 12 of the semiconductor body 10 which is opposite the surface 11. The trench 13 can extend very deep into the semiconductor body 10 in comparison with an opening width of the trench 13 at the surface of the semiconductor body.

When the trench 13 has been produced, a porous semiconductor body region 14 is produced, starting from this trench, in the semiconductor body 10 along the trench 13. By way of example, the porous semiconductor body region 14 is produced by means of electrochemical etching of the semiconductor body in the trench 13. By way of example, this etching may be anodic oxidation of the semiconductor body 10. Hence, the porous semiconductor body region 14 is produced in the semiconductor body 10 from the surface of the trench 13 in a direction perpendicular thereto. The extent of the porous semiconductor body region 14 into the semiconductor body from a side wall of the trench 13 in a direction perpendicular thereto is called the width B of the porous semiconductor body region 14. Furthermore, the porous semiconductor body region 14 produced has a length L along the side walls of the trench 13 which is perpendicular to the width B. The length L thus extends in a direction from the surface 11 to the opposite surface 12. The ratio L/B of the porous semiconductor body region 14 may be greater than 3 in this case.

As FIG. 1b shows, the production of the porous semiconductor body region 14 is followed by the trench 13 being filled again with a material 15 of the semiconductor body 10. This filling can be accomplished by epitaxially depositing the semiconductor material 15 in the trench, for example. A porous semiconductor body region 14 has multiple adjacent pores with pore sizes in the range from 2 nm to 200 nm, for example. In this context, both what are known as mesopores, with pore diameters in the range from 2 nm to 50 nm, and what are known as macropores, with pore diameters in the range from 50 nm to 200 nm, may arise. The pore walls situated between the pores comprise the material of the semiconductor body 10. The proportion of the remaining semiconductor body material in the porous semiconductor body region can be set to a proportion in the range from 10% to 70% of the volume of the porous semiconductor body region, for example. This allows epitaxial deposition of the semiconductor material 15.

FIG. 2 shows an embodiment of the method, in which first of a plurality of trenches 13', 13", 13''' are produced in the semiconductor body 10. Along all the exposed surfaces of these trenches, porous semiconductor body regions 14', 14", 14''' are then produced in each trench. These adjacent porous semiconductor body regions 14', 14", 14''' can be produced between at least two of such trenches 13', 13", 13''' with a width B such that adjacent porous semiconductor body regions 14', 14", 14''' touch and can merge to form one cohesive semiconductor body region.

Figure 3:
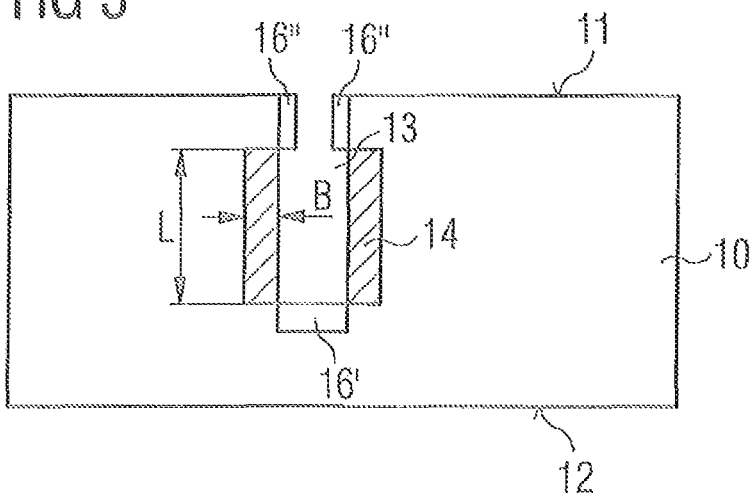
FIG. 3 shows the fabrication of a porous semiconductor body region along a portion of the side wall in a trench.

A further exemplary embodiment is shown in FIG. 3, in which the porous semiconductor body region 14 is produced only along a portion of the side walls of a trench 13. This can be achieved by producing a mask 16 in the trench, for example. A portion 16' of the mask 16 may cover the base and a lower portion of the side wall of the trench 13, for example. A further portion 16" of the mask 16 may alternatively or additionally also cover an upper portion of the side wall of the trench 13. The porous semiconductor body region 14 is then produced during the anodic oxidation, for example, only at the still exposed surfaces of the semiconductor body 10 in the trench 13.

Figure 4:
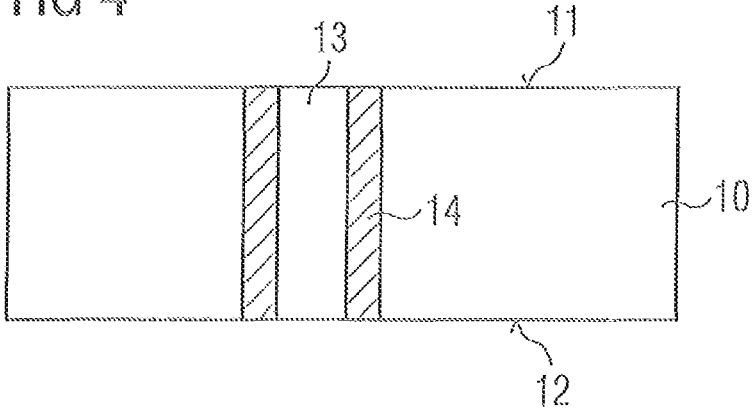
FIG. 4 shows the fabrication of a continuous porous semiconductor body region.

FIG. 4 shows a variant embodiment of the method, in which the porous semiconductor body region is formed up to the rear surface 12 of the semiconductor body 10. The continuous structure—ranging from the surface 11 to the surface 12—of the porous semiconductor body region 14 can be achieved by already forming the trench 13 from the surface to the surface 12 and hence subsequently producing a continuous structure for the porous semiconductor body region in the already continuous trench 13. Alternatively, the trench can first of all be produced to a depth in the semiconductor body 10, as already described above, and the porous semiconductor body region 14 can be formed along the side walls of this trench. Subsequently, the rear surface 12 of the semiconductor body 10 can then be removed mechanically and/or chemically at least as far as the porous semiconductor body region 14.

An exemplary embodiment of a method for introducing a foreign substance into a semiconductor body 10 using a porous solid-state region 14 will now be described with reference to FIGS. 5a to 5c.

FIG. 5a shows a semiconductor body 10, the surface 11 of which has a mask 20 formed on it. The mask 20 covers the surface 11 of the semiconductor body 10. The mask 20 contains a mask opening 21 in which the surface 11 of the semiconductor body 10 remains uncovered. As FIG. 5b shows, elongate porous semiconductor body regions 14—extending into the semiconductor body 10 in the direction of the surface 12—are produced beneath the mask opening 21 in the semiconductor body 10, as described above. These porous semiconductor body regions 14 have a higher diffusion length for the foreign substance that is to be introduced, in comparison with the undisturbed monocrystalline semiconductor body 10. On account of the faster diffusion of foreign substances along the porous semiconductor body regions 14 in comparison to the diffusion of the foreign substances in the undisturbed monocrystalline semiconductor body 10, foreign substance regions 22 are formed in the semiconductor body 10 along the porous semiconductor body regions 14, said foreign substance regions having a substantially greater extent in the vertical direction from the surface 11 to the surface 12 than in a lateral direction parallel to the surface 11.

When producing insulating layers, for example, the porous semiconductor body regions 14 can be converted into an insulating material, e.g. by means of oxidation. In this case, the conversion process in the semiconductor body regions 14 that have been rendered porous takes place considerably faster than in the undisturbed monocrystalline semiconductor body 10. Such porous semiconductor body regions 14 converted into insulating material can be regarded in the manner of homogeneous insulating regions. In the case of power semiconductor elements, for example, there is no or only little reduction in the breakdown field strength in the semiconductor body regions 14 converted into insulating regions in comparison with an insulating region which is converted from undisturbed monocrystalline semiconductor body 10. This applies particularly so long as the pore size of the porous semiconductor body regions 14 is in the same order of magnitude or smaller than the free path length of charge carriers in air. Insulating regions in the semiconductor body 10 which still have pores have the advantage of a stress-reducing action by the mechanical stress brought about on account of the different material properties of the insulating material and of the semiconductor material.

Exemplary applications of the presented method for introducing a foreign substance into a semiconductor body are as follows:

Formation of an insulating layer between two semiconductor body regions, particularly lateral insulation of integrated circuits in which it is possible to cut down on trenches for dielectric insulation and to replace them with junction isolation, for example.

Formation of a connection for a buried dopant region, for example in an integrated circuit. The connection, e.g. a sinker, may have very low lateral out-diffusion in this case.

Production of a plated-through hole for a semiconductor body, as required for drain-up and source-down semiconductor elements or for two-way inhibiting semiconductor elements, for example.

Formation of a dopant column, for example for superjunction semiconductor elements.

Formation of deep insulating layers, as are needed in novel semiconductor elements such as a TEDFET, for example.

An exemplary application of the method is shown in FIG. 6. The example shows a silicon substrate which is n-doped, for example, in the semiconductor body 10 and which has a high-voltage diode 30 formed in it. The high-voltage diode 30 has a cathode electrode 31 on a cathode connection region 32. The cathode connection region 32 and the cathode electrode 31 are formed at a first surface 11 of the semiconductor body 10. An anode region 33 with an anode electrode 34 fitted to it is formed at a second surface 12 of the semiconductor body 10, which is opposite the first surface 11. In this case, the anode region 33 has p-type doping and forms a pn-junction with the n-doped silicon substrate. Extending through the semiconductor body 10 is an isolating diffusion region 35 which has been produced on the basis of the previously described method for introducing a foreign substance into the semiconductor body 10 and which bounds the high-voltage diode 30. The isolating diffusion region 35, having a porous semiconductor body region 14 and a diffused foreign substance region 22, divides the semiconductor body 10 into a subregion 10a, in which the high-voltage diode is formed, and an adjacent subregion 10b of the semiconductor body 10.

The inhibiting pn-junction of the high-voltage diode is situated between the anode and the n-doped substrate in FIG. 6. In the case of conventionally produced diodes, the anode is provided by driving in a pn-junction from the front. This results in an excessive field increase at the edges of the p-type anode on account of the geometric effect of the doping. In the case of isolation-diffused edges, the excessive field increase at the edges of the p-type anode is not present. The geometric effect lowers the field strength in the case of inhibiting. The highest field strength occurs at the cathode-side surface. This field strength is not higher than in the homogeneous region of the anode, however. Edge terminations with isolation diffusion can be dimensioned much more easily than conventional ones. Isolation diffusion are also used in thyristors, GTOs, bipolar transistors, IGBTs or other high-voltage elements, for example.

The exemplary embodiments of a method for fabricating a porous semiconductor body region have the following features:
  producing at least one trench in the semiconductor body, starting from a surface of the semiconductor body,
  subsequently producing at least one porous semiconductor body region in the semiconductor body starting from the at least one trench at least along a portion of the side walls of the trench,
  subsequently filling the trench with a semiconductor material of the semiconductor body.

The production of the at least one trench in the semiconductor body as described in the exemplary embodiments allows the production of a porous semiconductor body region which extends deep into the semiconductor body along the trench walls. The access by a tool which is required for producing the porous semiconductor body region, for example in the case of anodic oxidation of the semiconductor body, through the trench allows the production of elongate structures in the porous semiconductor body regions along the (length) of the trench walls with only small extents in a direction perpendicular to the trench walls (width). In this case, the tool required can be used on the entire surface area of the trench walls in order to fabricate the porous semiconductor body region and can penetrate the semiconductor body. As soon as the access by the tool to the semiconductor body through the trench is stopped, the fabrication of the porous semiconductor body region in the trench is also stopped. Hence, it is thus possible to produce a very finely patterned porous semiconductor body region, for example, with a very high ratio L/B of length to width (L/B>>1). The ratio L/B of length to width may be greater than 3 in this case, for example. It is therefore possible to provide porous semiconductor body regions which are locally bounded at the surface of the semiconductor body on account of a small width and which take up only a small amount of surface area, but which extend a long way into the semiconductor body on account of the great length.

In one development of the method, it is possible to produce a plurality of adjacent trenches, starting from which it is possible to fabricate a plurality of adjacent porous semiconductor body regions. By way of example, the trenches can be formed to be very narrow. The distances between the trenches may be identical or else may vary. In one embodiment, at least two adjacent porous semiconductor body regions can be produced such that a relatively large cohesive porous semiconductor body region is produced.

In one exemplary embodiment, the at least one trench can be filled, for example with the semiconductor material of the semiconductor body, by means of epitaxial deposition.

The exemplary embodiments of a method for introducing a foreign substance into a semiconductor body have the following features:
  fabrication of a porous semiconductor body region through at least one trench, as described above,
  provision of a foreign substance in the porous semiconductor body region,
  heating of the semiconductor body with the porous semiconductor body region produced therein, with the foreign substance diffusing along the porous semiconductor body region.

The porous semiconductor body region has a higher diffusion length than the semiconductor body per se. This allows the foreign substance that is to be introduced to diffuse along the porous semiconductor body region more quickly than in the semiconductor body. Since the porous semiconductor body region is formed along a trench, the foreign substance can penetrate deep into the semiconductor body along this porous semiconductor body region. Diffusion of the foreign substance out of the porous semiconductor body region into the pore-free semiconductor body will take place substantially more slowly than the diffusion along the porous semiconductor body region on account of the different diffusion lengths. Therefore, deliberate orientation of the porous semiconductor body region allows diffusion to be advanced more quickly in this direction as a preference. Furthermore, deliberate adjustment of the pore size in the porous semiconductor body region allows the diffusion length to be influenced. Short diffusion times can be achieved if the semiconductor body is heated at least to a temperature in the range from 800° C. to 1200° C., for example at least to a temperature in the range from 900° C. to 1200° C.

In one embodiment of the method, the porous semiconductor body region is produced such that the porous semiconductor body region extends from a surface of the semiconductor body into the semiconductor body. This allows the foreign substance to be provided at the surface of the semiconductor body, for example. In one embodiment, this can be accomplished by providing the foreign substance as a solid layer at the surface of the semiconductor body. Alternatively, the foreign substance can be provided in gaseous form at the surface of the semiconductor body. In another embodiment, the foreign substance is implanted in the porous semiconductor body region.

The foreign substances provided may be oxygen or a dopant for the semiconductor body, for example. In one embodiment, the foreign substance diffuses out of the solid-state region into the semiconductor body.

The invention claimed is:

1. A method for introducing a dopant into a semiconductor body, comprising:
  fabricating a porous semiconductor body region, the fabricating including,
    producing at least one trench in the semiconductor body, starting from a surface of the semiconductor body,
    producing at least one porous semiconductor body region in the semiconductor body starting from the at least one trench at least along a portion of a side wall of the at least one trench, the producing of the at least one porous semiconductor body region providing at least two adjacent porous semiconductor body regions, the at least two adjacent porous semiconductor body regions providing a cohesive porous semiconductor body region, and
    filling the at least one trench with a semiconductor material of the semiconductor body,
  providing the dopant at the surface of the semiconductor body,
  heating the semiconductor body with the porous semiconductor body region produced therein, wherein the dopant diffuses through the porous semiconductor body region into the semiconductor body.

2. The method according to claim 1, wherein the porous semiconductor body region is produced such that the porous semiconductor body region extends from the surface of the semiconductor body into the semiconductor body.

3. The method according to claim 1, wherein the dopant is provided as a solid layer at the surface of the semiconductor body.

4. The method according to claim 1, wherein the dopant is provided in gaseous form at the surface of the semiconductor body.

5. The method according to claim 1, wherein the dopant is implanted into the porous semiconductor body region.

6. The method according to claim 1, wherein the dopant provided is oxygen.

7. The method according to claim 1, in which the dopant diffuses through the porous semiconductor body region into the semiconductor body, the semiconductor body adjoining the porous semiconductor body region.

8. The method according to claim 1, wherein the semiconductor body with the porous semiconductor body region produced therein is heated at least to a temperature in the range from 800° C. to 1200° C.

9. The method according to claim 1, wherein the producing the at least one trench provides a plurality of adjacent trenches.

* * * * *